United States Patent [19]

Rapoport et al.

[11] 4,037,533

[45] July 26, 1977

[54] COLOR LITHOGRAPHY USING A RANDOM PATTERN SCREEN

[75] Inventors: Sidney L. Rapoport, Lagrangeville; Douglas F. Mitchell, Brooklyn, both of N.Y.

[73] Assignee: Rapoport Printing Corporation, New York, N.Y.

[21] Appl. No.: 692,206

[22] Filed: June 2, 1976

Related U.S. Application Data

[63] Continuation-in-part of Ser. No. 529,614, Dec. 5, 1974, abandoned.

[51] Int. Cl.$^2$ .............................................. B41M 1/14
[52] U.S. Cl. ........................................ 101/211; 96/30; 96/31; 96/45; 96/33; 96/116; 101/450
[58] Field of Search ....................... 96/30, 31, 45, 116, 96/33; 101/211, 450

[56] References Cited

U.S. PATENT DOCUMENTS 547,780  10/1895  Gast .................................... 96/116
3,581,660  6/1971  Rapoport et al. ..................... 96/31

OTHER PUBLICATIONS

The Lithographer's Manual, 4th Ed., 1966, pp. 5:58–5:61, 6116.
The Handbook of Modern Halftone Photography, Nov., 1965, pp. 100–101.

*Primary Examiner*—Edward C. Kimlin
*Attorney, Agent, or Firm*—Mandeville and Schweitzer

[57] ABSTRACT

Method for substantially improving the shadow detail and color spectrum range of multicolored lithographic reproductions including the preparation of and printing with standard halftone printing plates and overprinting with a secondary printing plate made from a color separation used in making the halftone printing plates; the secondary printing plate being made from a secondary image exposed through a random pattern screen.

10 Claims, No Drawings

COLOR LITHOGRAPHY USING A RANDOM PATTERN SCREEN

RELATED APPLICATIONS

This application is a continuation-in-part of copending application Ser. No. 529,614 filed Dec. 5, 1974, now abandoned, entitled "Color Lithography." BACKGROUND AND PRIOR ART The present invention pertains to an improved process for the lithographic reproduction of multicolored visual subject matter having gradations of tonal density such as photographs and paintings. More specifically, the invention provides a method for significantly improving the shadow detail, dimension and depth, as well as increasing the spectural range of multicolor lithographic reproduction. As used herein, the term "color" includes black and the term "primary color" means magenta, cyan or yellow.

In the Rapoport et al, U.S. Pat. No. 3,581,660, the applicants describe a process for the photolithographic reproduction of grey tone, i.e., black and white visual subject matter including dual printing steps, each done with a printing plate may be well known photolithographic techniques from a master and secondary negative produced b exposing the original subject matter to the light source through a patterned transparent screen. The screen used to make the master negative is a conventional halftone screen while the screen used for the secondary negative is a random pattern contact screen. The secondary negative is exposed to the original copy for a longer time interval, under the same lighting conditions, to produce a printing plate that when printed in registry with the master printing plate results in a final reproduction having extraordinary detail in the shadow areas of the original copy.

Prior art patents disclosing the use of other than halftone images and printing plates for making multicolored lithographic reproductions include among others the Cooke U.S. Pat. No. 3,130,669; the Weyl U.S. Pat. No. 809,157 and that Gast U.S. Pat. No. 547,780.

The Cooke patent describes a complex procedure for making a "screenless" halftone negative from each color separation by employing a granular surfaced screen interposed between a treated and bleached continuous tone color separation of the original subject matter and a light source during exposure. The Cooke patent teaches a method for multicolored lithographic reproduction which closely parallels the widely used four color halftone method with the modification of utilizing granular screens in place of the ruled halftone screens in making the images from which the printing plates are produced.

Similarly, the Weyl patent teaches that the "moire" effect can be eliminated in multicolored lithography by substituting a "stipple" pattern screen for the ruled halftone screen in making each of the printing plate negatives from the color separations. The Gast patent describes a three color lithographic process employing diagonally ruled halftone screens for making the blue and red printing plate negatives and a stipple screen for making the yellow printing plate negative.

High quality, multicolored photolithographic reproductions of the type currently in widespread commercial use for the printing of magazines and books, for example, are produced by the technique known in the art as four color halftone lithographic printing. Four color halftone lithographic printing involves the production of four separate halftone negatives, each from a separate continuous tone negative color separation of the original subject matter and the subsequent production of a corresponding printing plate from each of the halftone negatives. The final reproduction is obtained by printing a substrate with all four printing plates on a four color printing press in sequence and in registry, using a printing ink for each plate that approximates the color of the corresponding areas of the original subject matter. Typically, a halftone negative and corresponding printing plate is made for each of the primary colors, magenta, cyan and yellow and optionally, one for black, by techniques well known in the art.

The final prints from the standard three or four color halftone process are limited in detail in shadow or dark areas relative to the original subject matter and inherently lack the color spectrum range of the original copy since only the primary colors are printed. A further significant limitation of the conventional halftone color process is that additional strong colors such as green, orange and purple cannot be printed in addition to the four primary colors since a moire effect would almost surely result. The moire effect is well known in the art and is manifested by a mechanical appearing pattern in the final image when a number of halftone prints are made in registry as in color lithography. To avoid the moire effect in the conventional four color process, each of the halftone negatives are made at a different screen angle to prevent the respective halftone dot patterns from directly overlying each other. The conventional color lithographic process is limited in the number of strong colors that can be used by the availability of only three or four screen angles that are far enough apart, i.e., 150° to 30° to avoid a moire effect.

A primary objective of the invention is to provide a multicolor lithographic reproduction process wherein the accuracy of color reproduction and depth and dimensional perception, relative to conventional halftone color reproductions, is substantially improved to an unexpected degree without creating a moire pattern.

A further objective of the invention is to reproduce greater shadow detail in multi-color lithographs. A still further objective of the invention is to increase the color spectrum reproduced by color lithography. A still further objective of the invention is to provide a method for utilizing the screens and teachings of the applicants' prior U.S. Pat. No. 3,581,660 for the improved lithographic reproduction of multicolored subject matter. A still further objective is to produce multicolor lithographic prints with a minimum, if any, color correction prior to making the final negatives from which the printing plates are produced.

DESCRIPTION OF THE INVENTION

The foregoing and other objectives and advantages of the invention are realized by the new method, which includes the following manipulative steps:

1. producing a continuous tone color separation of the visual subject matter for each of the primary colors, magenta, cyan and yellow;

2. exposing each of the color separations to a separate photographically sensitive surface through a halftone screen for a first predetermined time interval to produce a halftone image of each color separation;

3. converting each of the halftone images to a halftone printing plate by utilizing accepted and well known procedures in the lithographic art;

4. exposing at least two of the primary color separations to a separate photographically sensitive surface through a random pattern screen for a second predetermined time interval to produce two separate secondary images;

5. converting each secondary image into a secondary printing plate, and 6. printing a substrate with the halftone printing plates and the secondary printiang plates in sequence and in registry to produce a single reproduction of the visual subject matter.

The steps of making the continuous tone color separations and converting the halftone and secondary images into printing plates, are performed according to accepted and well known techniques in the lithographic art.

According to the invention, the random pattern screen used in making the secondary images is a photographic transparency having a large plurality of irregularly shaped areas per square inch disposed therein in a photographic pattern. Preferably, the random pattern screen includes at least 22,500 irregularly shaped areas per square inch of screen surface and can have as many as 250,000 irregular areas per aquare inch. Typically, from about 40,000 to about 100,000 irregularly shaped areas per square inch are present on the random pattern screen. The secondary images reproduce only the darker tones of the color separations from which they are made and is void of many light and middle tones that are present on the corresponding halftone image.

In accordance with a specific aspect of the invention, the photographically sensitive surface used to make the secondary image is prefogged prior to exposure to the color separations to increase its speed and sensitivity. The prefogging step includes the exposure of the sensitive surface to a very dim diffused light source, for a short period of timme. The prefogging exposure is advantageously chosen to supply the sensitive surface with from about 1 to about 5% of the quantity of light supplied to the sensitive surface during main exposure to the color separation in making the secondary image.

According to a preferred aspect of the invention, the two secondary images and printing plates are made from each of the magenta and cyan color separations, although a secondary image and printing plate can be made from each of the primary and black color separations and each of the secondary printing plates used to print the final reproduction.

Preferably, a black color separation and corresponding halftone image and printing plate is made in addition to the primary color halftone images and printing plates and printed on the substrate in the same manner as the primary color printing plates. The black separation in what is known in the art as a skeleton image and only reproduces areas of the original subject matter that is of a grey tone.

Before proceeding with the description of certain characteristics of the invention and preferred embodiments, a number of terms useful for expressing these characteristics will be defined.

The optical density or density of a color tone is a commonly used term to express the darkness or lightness of the tone. When the term optical density or density is used in describing an image having gradations of tonal values, the term refers to a particular point of the image or area of the image having a constant, single tonal value throughout.

Optical density is a well known concept in the graphic arts and is typically and most commonly expressed as a reading on a Density Scale. The Density Scale assigns numerical values to tones from a value of 0 for the complete absence of tone, i.e., pure white or a clear transparency to a maximum value of 3.0 for black. A printed scale of grey tones, known in the art as the MacBeth Grey Scale is distributed by and available from the MacBeth Company, Division of Killmorgen Corporation, P.O. Box 950, Newburgh, N.Y. 12550. The printed MacBeth Scale is inherently limited in its range of grey tones since it is a printed reproduction, and extends from a value of 0.05 to 2.1. Typically, high quality halftone reproductions are excellent in reproducing densities lighther than about 1.5 on the Density Scale, but are lacking in the dark or shadow areas having a density greater than 1.5.

The MacBeth and other companies also manufacture color and black and white reflection and transmission densitometers, which are automatic photoelectronic instruments for measuring the density of either opaque or transparent images respectively in terms of a reading on the Density Scale. The densitometer manufactured and sold by the MacBeth Company and other companies are commonly used quality control instruments in the graphic arts industry and densitometer readings are the accepted standard for evaluating the quality of printed reproductions. These instruments typically measure optical densities on a scale from 0 to 2.50.

It should be understood that when the density of an opaque surface is specified, the given reading is made on a reflection densitometer and on a transmission densitometer when the reading is for a transparent material. All density values for multicolored materials are obtained by a color densitometer while those for grey images are obtained from a black and while densitometer.

The transparency factor of a transparent material having a grey tonal image, is defined as the overall or "average" optical density of the image measured on the Grey Density Scale by a light transmission densitometer. The measured material can be of a single optical density throughout, in which case the transparency factor is that optical density, or the material can have areas and points of different densities such as the screens of the invention in which case the transparency factor is an "average" measure of the overall density measured by projecting light through a representative area of the image and taking a single reading on an appropriate densitometer.

As used herein, the term contrast factor denotes the range of grey tones present in the image being measured, the contrast factor of a surface having the same optical density throughout being zero. The contrast factor can be defined as the difference between the highest and lowest density found on a measured surface. For example, a transparent image having relatively clear areas, i.e., an optical density of about 0.05 and relatively black areas, i.e, an optical density of about 2.0, would have a contrast factor of 1.95.

The lower the absolute value of the contrast factor of a material having varying grey tones, the less contrast the material appears to have when visually examined. On the other hand, the transparency factor of an image is a measure of its overall light or dark appearance; the higher the transparency factor, the darker or blacker the material appears. It should be realized that materials can have the same contrast factor with significantly different transparency factors and vice versa. The specification of both the transparency factor and contrast factor for a grey phototransparency is thherefore an accurate measure of its optical characteristics and appearance and would permit one skilled in the art to produce the image without undue experimentation.

Preferred random pattern screens for use in making the secondary images of the invention are described in the applicants' prior U.S. Pat. No. 3,581,660 and in applicants' copending U.S. patent application Ser. No. 581,293 filed Oct. 2, 1974. The disclosure of U.S. Pat. No. 3,581,660 is incorporated herein by reference. The screens described in the prior patent and copending patent application are of the contact type, i.e, they are in direct contact with the photographically sensitive surface during exposure, and are phototransparencies having a photographic pattern of a large plurality of irregularly shaped areas per square inch of screen surface.

The random pattern screen of the copending application can be characterized as a positive image photographic transparency having disposed therein a large plurality, preferably at least about 50,000 to 100,000 and as many as 250,000 or more irregularly shaped highlight areas per square inch of screen surface. The irregularly shaped highlight areas are possitive photographic images disposed in a random pattern over the screen surface. Contrasting areas are interposed between highlight areas and are present in about the same concentration (areas/sq.in.) as the highlight areas. The highlight areas have greater light transmission properties thhan the contrasting areas; however, the grey tone of the screen varies within the highlight and contrasting areas as well as between them, as will be further described hereinafter. The highlight areas have a lower transparency factor than the contrasting areas which separate the highlight areas. The new screens have a transparency factor of about 0.25 to about 0.60 and a contrast factor of about 0.75 to about 1.5. Preferably, the optical density of the new screens can very from about 0.17 at the lightest point to about 1.6 at the darkest point.

According to a specific aspect of the new screens, the highlight areas have tonal gradations from their periphery to their central region; the lowest densities of the screen being found in the central region of the highlight areas. Similarly, the contrasting areas have differing optical densities relative to each other and tonal gradations within any particular contrast area. The points of highest density in the new screen are found in the contrasting areas.

The new screens can be made by first exposing a photographically sensitive film surface to a diffused light source with a transparent plate having a physically inscribed pattern on at least one of its surfaces interposed between the light and the film. The transparent plate can be a glass plate that has been acid etched to inscribe both surfaces with a fine texture comprising a large number of light disruptive projections and depressions which create shadowed area when diffused light passes through the plate and onto a photographically sensitive film surface. The film is exposed to the light source through the plate for a time interval adequate to result in a transparency factor greater than about 1.5, and less than about 2.0, preferably from about 1.6 to about 1.8, when developed as a negative transparency to have a contrast factor less than about 1.5 and greater than 1.0, preferably from about 1.2 to about 1.4. The density of the negative transparency can vary from 1.0 to about 2.5.

Preferably, the exposure time interval to make the negative transparency of the transparent plate is performed in two segments with the plate being rotated from about 90° to about 180° or the equivalent thereof between time segments, in order to obtain a final screen with the desired concentration of highlight areas. The concentration of highlight areas will be approximately twice the number of light disruptive projections on the surface of the transparent plate which is usually about 50,000 per square inch. Preferably, the second segment of the exposure time interval is about twice as long as the first segment.

The negative transparency of the transparent plate is then interposed between another photographically sensitive film surface and a diffused light source and an exposure is made for a sufficient time interval to result in optical density from about 0.17 to about 1.6 for the developed positive image phototransparency and a transparency factor from 0.25 to 0.60. The exposed surface is developed in the ordinary manner well known in the art to produce a phototransparency having a contrast factor from about 0.75 to about 1.5. Tje resulting phototransparency is a positive image of the transparent plate.

The exposure to produce the negative and positive transparencies of the plate can be, and preferably are, made by direct exposure to the light source without the interposition of a camera lens.

With regard to the foregoing description of the method for making the new screens, it should be appreciated that the transparency factor of either the initial negative transparency or final positive transparency is a direct function of the time of exposure to the diffused light source and the intensity of the light source. Similarly, the contrast factor of the the negative and positive image transparencies is a direct function of the developing process, particularlay the time the photographically sensitive surface is in the developer solution. The foregoing parameters, which determine the ultimate characteristics of the new screens, can, of course, be varied and equivalents substituted to result in an equivalent positive image screen. The new screens, produced according to the foregoing procedure, are durable and can be repeatedly used in lithographic reproduction processes.

According to a specific aspect of the invention, the secondary images can be characterized by the optical density included, or even more accurately, excluded from their reproductive range. As previously indicated, the secondary images are "washed out," i.e., are void of light and many middle tones relative to the half tone image made from the same color separation. Typically, and in accordance with the invention, the secondary images only reproduce areas of the color separation they are made from that have an optical density greater than about 1.2; the lower densities from 0 to about 1.2 being specifically eliminated from the secondary images, and of course, the printing plates and printed images made therefrom.

The limited tonal range of the secondary images is obtained according to the invention by the characteristics of the random pattern screen chosen and the exposure conditions used. When the random pattern screen described in the applicants' referred to prior patent (U.S. Pat. No. 3,581,660) are used in making the secondary image, the exposure time interval, i.e., the aforementioned second predetermined time interval is from about 1.5 to about 2.5 as long as the first predetermined time interval. In further accordance with this specific aspect of the invention, the color separations used to make secondary images with the random pattern screens of the applicants' prior patent are positive separations rather than the commonly used negative separations. The use of positive separations permits more accurate control of the aforementioned exposure conditions and consistent results in making the secondary images.

The deletion of tones having a density less than about 1.2 in the secondary images made with the positive image screens described above and in applicants' copending application is obtained by the optical characteristics, including transparency and contrast factors, of the screen itself. Accordingly, the second predetermined time interval used in making secondary images with the described positive image screens is substantially the same as the first predetermined time interval used in making the corresponding halftone images. The color separations used for making secondary images with the new screens can be either positive or negative.

DESCRIPTION OF PREFERRED EMBODIMENTS

The specific characteristics of the invention will become more apparent when the description of the invention is read in view of the following examples:

EXAMPLE I

A separate continuous tone color separation is made for each of the colors magenta, cyan, yellow and black from the original subject matter which can be a multicolored photograph. The color separations are made by exposing the original subject matter to a continuous tone film through various filters that eliminate all light but that of the desired primary color. The filters used in making the color separations are the color complements of the primary colrs, a blue-violet filter being used for yellow, a green filter for magenta and a red-orange filter for the cyan. The black separation is made using a combination of filters to eliminate all but grey tones. The techniques for making continuous tone negative color separations are well known and accepted in the lithographic art and will not be described in detail.

Preferably, an electronic scanner of the PDI (Printing Development Industries) type is used to make the color separations since either positive or negative color separations can be readily made on this apparatus. Positive color separations are made for this example.

A separate halftone negative is made from each color separation in the usual manner of the art by exposing a separate photographically sensitive surface, i.e., the emulsion surface of a film, such as KODAK MP litho film to each of the color separations and a diffused light source through a 200 line halftone screen. The halftone exposure is typically from 10 to 20 seconds, usually 15 seconds, and is adequate to reproduce all tonal areas of color separation. To avoid a moire pattern in the final prints, each of the halftone exposures is made at a different and accepted screen angle as is customary in the art, typically 75° for magenta, 105° for cyan, 90° for yellow and 45° for black. The exposed film is developed to form halftone negatives. Each of the halftone negatives is converted to a half tone printing plate using a suitable metallic substrate and photopolymeric techniques that are well known in the art.

A secondary negative is made from the magenta and cyan color separations by exposing a separate photographically sensitive surface, such as KODAK MP litho film to each of the magenta and cyan separations through a random pattern screen that is in contact with the film emulsion. The random pattern screen used is a positive image phototransparency having a photographic pattern of about 100,000 highlight areas per square inch, a contrast factor of about 1.3, a density from about 0.22 to about 1.52 and a transparency factor of about 0.52.

The secondary negatives are made under substantially the same exposure conditions used in making the halftone negatives, i.e., exposure to the same light source under the same conditions for about the same time of 10 to 20 seconds, preferably about 15 seconds. Prior to exposing the film surface to the color separations through the random pattern screen to form the secondary images, the film surface is prefogged by exposing it to an 8 Watt bulb at about 6 feet for about 2 seconds. The prefogged and exposed films are developed in the usual manner to form the secondary negatives. The secondary negatives formed in the foregoing manner can be described as being overexposed relative to the corresponding halftone negative since light and middle tones of the color separation are washed out and are not reproduced. Typically, the secondary negatives according to the invention, reproduce only those areas of the color separations that have an optical density greater than about 1.2, i.e., from about 1.2 to about 2.5.

A secondary printing plate is made from each of the secondary negatives from a suitable metallic substrate, preferably aluminum, using photopolymeric techniques well known in the art in the same manner as the halftone printing plates.

The final multicolored reproductions are obtained by printing a suitable substrate typically paper, with each of the half tone and secondary printing plates in sequence and in registry on a standard four color printing press. The half tone plates are printed first, and the secondary plates are used for overprinting, although the order to printing does not significantly effect the quality of the final product. The final result obtained is substantially and unexpectedly better after both secondary plates are printed over the halftone printing, relative to overpringint with only either one of the secondary printing plates.

EXAMPLE II

Color separation, halftone negative and halftone printing plates are produced in the manner described for EXAMPLE I.

A secondary negative is made from each of the magenta and cyan color separations by exposing a separate film surface, such as KODAK MP litho film to each color separation and a diffused light source through a random pattern screen that is in contact with the emulsion surface of the film. The secondary film surface is prefogged according to the procedure given for the secondary film of EXAMPLE I.

The random pattern screen used in this example is described in the Rapoport et al. U.S. Pat. No. 3,581,660 and is a photographic transparency having a photographic pattern of about 40,000 irregularly shaped areas per square inch randomly dispersed over the screen surface. The screen used is a photographic negative as opposed to the positive image screen of EXAMPLE I.

According to a specific aspect of this example, the film surfaces used to make the secondary images are exposed to the color separations for a substantially longer time interval than the exposure time interval used in making the halftone negatives under the same lighting conditions. The secondary film exposure time interval is about twice that used for the halftone exposure, i.e., about 30 seconds and is chosen to result in secondary images that reproduce only those areas of color separation having an optical density greater than about 1.2, i.e., from 1.2 to about 2.5.

The prefogged and exposed films are developed in the usual manner to form a secondary negative for each of the magenta and cyan color separations. A secondary printing plate is made from each of the secondary negatives and a suitable metallic substrate, preferably aluminum, using photopolymeric techniques well known in the art.

The final multicolored reproductions are obtained by printing a suitable substrate, typically paper, with each of the halftone and secondary printing plates in sequence and in registry on a standard four color printing press. The order of printing does not appear to have a significant effect on the quality of the reproductions; however, the halftone printing plates are usually printed first.

The halftone and secondary printing plates of EXAMPLES I and II are printed with inks that can be chosen to reproduce the corresponding colors of the original copy as accurately as possible in combination. For example, the magenta halftone plate can be printed with Tose Magenta ink which is a red with a blue shade while a PMS (Patome Matching System) warm red which has an orange shade is used for the secondary magenta printing plate. The cyan halftone plate can be printed with a green shade Cyan Blue and the secondary cyan plate with a Reflex Blue which has a red shade. The yellow halftone plate can be printed with a Primrose Yellow. Standard black ink is used for the black halftone plate.

Of course, the particular color intensity and value of the printing inks chosen to print the halftone and secondary printing plates depends on the color and density characteristics of the original subject matter being reproduced and the effect desired by the lithographer. The secondary printing plates can be printed with virtually any color ink in order to obtain particular characteristics desired in the reproduction; i.e., starkness, warmth, mood, etc., and to supplement and/or enhance the halftone printing.

The lithographic reproductions made according to the foregoing procedures and using the described random pattern screens to make at least two secondary printing plates fromm the magenta, cyan the yellow color separations that reproduce only tones of the color separations used having optical density greater than about 1.2, contains startling shadow detail, and depending on the color inks chosen for the secondary printing steps, amazing accuracy in reproducing the colors of the orginal subject matter and/or a substantial increase in the reproduced color spectrum.

The new method provides the lithographer with the ability to greatly expand the shadow detail and color spectrum of his color reproductions without creating undesirable moire patterns and at a reasonable cost employing standard equipment presently used in color lithography.

It should be understood that the specific form of the invention hereinabove described is intended to be representative only, as certain modifications within the scope of this teaching will be apparent to those skilled in the art of lithographic reproduction. Accordingly, reference should be made to the following claims in determining the full scope of the invention.

We claim:

1. In the method of reproducing multicolored visual subject matter having gradations of tonal density, including the steps of making a continuous tone color separation for at least each of the colors cyan, magenta and yellow, producing a halftone image from each of said color separations, converting each of said halftone images to a halftone printing plate, and printing a substrate with each of said halftone printing plates in registry, the improvement comprising the steps of making at least two secondary images, converting each of said secondary images into a secondary printing plate and printing said substrate with each of said secondary printing plates in registry with said halftone printing plates, each of said at least two secondary images being made by exposing a different one of said magenta, cyan and yellow color separations to a photographically sensitive surface through a random pattern screen.

2. The improved method according to claim 1 wherein said secondary images are overexposed relative to said half tone images, to reproduce only areas of the color separation from which it is made having an optical density greateer than about 1.2.

3. The improved method according to claim 1 wherein said halftone images are produced by exposing under first predetermined exposure conditions, each of said color separations to a separate photographically sensitive surface through a halftone screen and said secondary images are produced by exposing under second predetermined exposure conditions at least two of said magenta, cyan and yellow color separations; said first and second predetermined exposure conditions, including exposure time interval and intesity of light source being substantially the same.

4. The improved method according to claim 3 wherein said random pattern screen is in contact with said photographically sensitive surfaces during exposure to produce said secondary images.

5. The improved method according to claim 1 wherein a color separation, halftone image and halftone printing plate is made for the color black.

6. The improved method according to claim 1 wherein a secondary image is made for the colors magenta and cyan.

7. The improved method according to claim 1 wherein said random pattern screen is a photographic transparency having at least about 50,000 irregularly shaped highlight areas per square inch, a transparency factor from about 0.25 to about 0.60 and a confrast factor from about 0.75 to about 1.5.

8. The improved method according to claim 7 wherein said random pattern screen has at least about 100,000 irregularly shaped highlight areas per square inch.

9. The improved method according to claim 7 wherein said random pattern screen has an optical density from about 0.17 to about 1.6.

10. A multicolored lithographic reproduction of visual subject matter made according to the method of claim 1.

* * * * *